United States Patent
Ward et al.

[11] Patent Number: 5,596,673
[45] Date of Patent: Jan. 21, 1997

[54] EVAPORATION CRUCIBLE ASSEMBLY

[75] Inventors: Anthony T. Ward, Webster; Donald J. Teney, Rochester; Steven J. Grammatica, Penfield, all of N.Y.

[73] Assignee: Xerox Corporation, Stamford, Conn.

[21] Appl. No.: 342,330

[22] Filed: Nov. 18, 1994

[51] Int. Cl.⁶ .............................. B01D 7/00; F27B 14/10; C23C 16/00
[52] U.S. Cl. .......................... 392/389; 219/541; 118/726; 427/593; 432/263
[58] Field of Search ........................... 392/389; 219/420, 219/541, 546; 373/118; 118/726, 727; 432/156, 263; 427/543

[56] References Cited

U.S. PATENT DOCUMENTS

| | | | |
|---|---|---|---|
| 2,902,574 | 9/1959 | Gudmundsen et al. | 118/726 |
| 3,746,502 | 7/1973 | Erhart et al. | 432/263 |
| 3,748,090 | 7/1973 | Ciuffini et al. | 118/726 |
| 4,700,660 | 10/1987 | Levchenko et al. | 118/726 |
| 4,854,264 | 8/1989 | Noma et al. | 118/719 |
| 5,167,984 | 12/1992 | Melnyk et al. | 427/593 |
| 5,417,766 | 5/1995 | Floryan et al. | 118/726 |

Primary Examiner—Geoffrey S. Evans
Assistant Examiner—Sam Paik
Attorney, Agent, or Firm—Zosan S. Soong

[57] ABSTRACT

There is disclosed a crucible assembly comprising: (a) an electrically conductive tube having a first end portion and a second end portion and defining an opening in the surface of the tube, wherein the tube defines an imaginary horizontal line which bisects the cross-sectional dimension of the tube and an imaginary vertical line which bisects the cross-sectional dimension of the tube; and (b) at least one power connection area, operatively associated with the first end portion of the tube, wherein for the crucible assembly having only one power connection area associated with the first end portion, the one power connection area is positioned above the imaginary horizontal line on the same side of the horizontal line as the opening in the tube surface, wherein for the crucible assembly having at least two power connection areas associated with the first end portion, the at least two power connection areas permit coupling of at least two power cables.

7 Claims, 5 Drawing Sheets

EVAPORATION CRUCIBLE ASSEMBLY

This invention relates generally to an evaporation crucible assembly and more specifically to a crucible assembly wherein the placement of the power connection areas minimize or eliminate condensate clogging of the exit openings.

A number of processes involves the sublimation of a solid material directly to a vapor from a heated source under vacuum. The vapor is typically collected by condensation back to a solid on a suitable receiving substrate at some temperature less than the sublimation temperature of the original solid material. The sublimation process may be used for example to deposit photoconductive material on a substrate during the fabrication of a photoreceptor. The heated source typically has the form of a resistively heated tube crucible with an exit opening such as that illustrated in Erhart et al., U.S. Pat. No. 3,746,502. The exit opening is intended to allow the free escape of sublimed vapor. A problem can arise if the tube crucible and exit opening temperatures are not high enough or uniform enough to permit egress of the vapor without condensation either in the tube itself or at the exit opening. Condensation in the exit opening, once initiated, may rapidly cause complete blockage of the affected region because the surface temperature of the solid condensate (which is the site for additional condensation) is anticipated to be much lower than the temperature of the crucible. This is because the thermal conductivity of the condensate, which may be an organic or inorganic solid, is much lower than that of the crucible, which may be metal. Restriction of the exit opening area by condensate blockage adversely affects the yield of sublimed material per unit time and the thickness uniformity of the film of condensed material collected on the receiving substrate. The present inventors have found that the exit opening positions most susceptible to condensate clogging are the locations of minimum exit opening temperature and maximum crucible floor to exit opening temperature differentials. The instant inventors have concluded that a new crucible assembly design exhibiting a more uniform temperature distribution, especially a lower crucible floor to exit opening temperature differential, or exhibiting a higher exit opening temperature may be less vulnerable to condensate clogging of the exit opening.

Conventional evaporation crucibles and vacuum evaporating apparatus are disclosed in Erhart et al., U.S. Pat. No. 3,746,502, Levchenko et al., U.S. Pat. No. 4,700,660, and Noma et al., U.S. Pat. No. 4,854,264, the disclosures of which are totally incorporated by reference.

SUMMARY OF THE INVENTION

It is an object in embodiments of the instant invention to reduce or eliminate condensate clogging of the exit opening in a crucible assembly.

This object and others are accomplished in embodiments of the present invention by providing a crucible assembly comprising:
  (a) an electrically conductive tube having a first end portion and a second end portion and defining an opening in the surface of the tube, wherein the tube defines an imaginary horizontal line which bisects the cross-sectional dimension of the tube and an imaginary vertical line which bisects the cross-sectional dimension of the tube; and
  (b) at least one power connection area, operatively associated with the first end portion of the tube, wherein for the crucible assembly having only one power connection area associated with the first end portion, the one power connection area is positioned above the imaginary horizontal line on the same side of the horizontal line as the opening in the tube surface, wherein for the crucible assembly having at least two power connection areas associated with the first end portion, the at least two power connection areas permit coupling of at least two power cables.

There is further provided in embodiments of the instant invention a crucible comprising:
  (a) an electrically conductive tube having a first end portion and a second end portion and defining an opening in the surface of the tube, wherein the tube defines an imaginary horizontal line which bisects the cross-sectional dimension of the tube and an imaginary vertical line which bisects the cross-sectional dimension of the tube; and
  (b) at least two power connection areas, operatively associated with the first end portion of the tube, to permit coupling of at least two power cables.

There is also provided in embodiments a crucible assembly comprising:
  (a) an electrically conductive tube having a first end portion and a second end portion and defining an opening in the surface of the tube, wherein the tube defines an imaginary horizontal line which bisects the cross-sectional dimension of the tube and an imaginary vertical line which bisects the cross-sectional dimension of the tube; and
  (b) a power connection area, operatively associated with the first end portion of the tube, wherein the power connection area is positioned above the imaginary horizontal line on the same side of the horizontal line as the opening in the tube surface.

BRIEF DESCRIPTION OF THE DRAWINGS

Other aspects of the present invention will become apparent as the following description proceeds and upon reference to the Figures which represent preferred embodiments.

Unless otherwise noted, the same reference numeral in the Figures refers to the same or similar feature.

DETAILED DESCRIPTION

Figure 1:
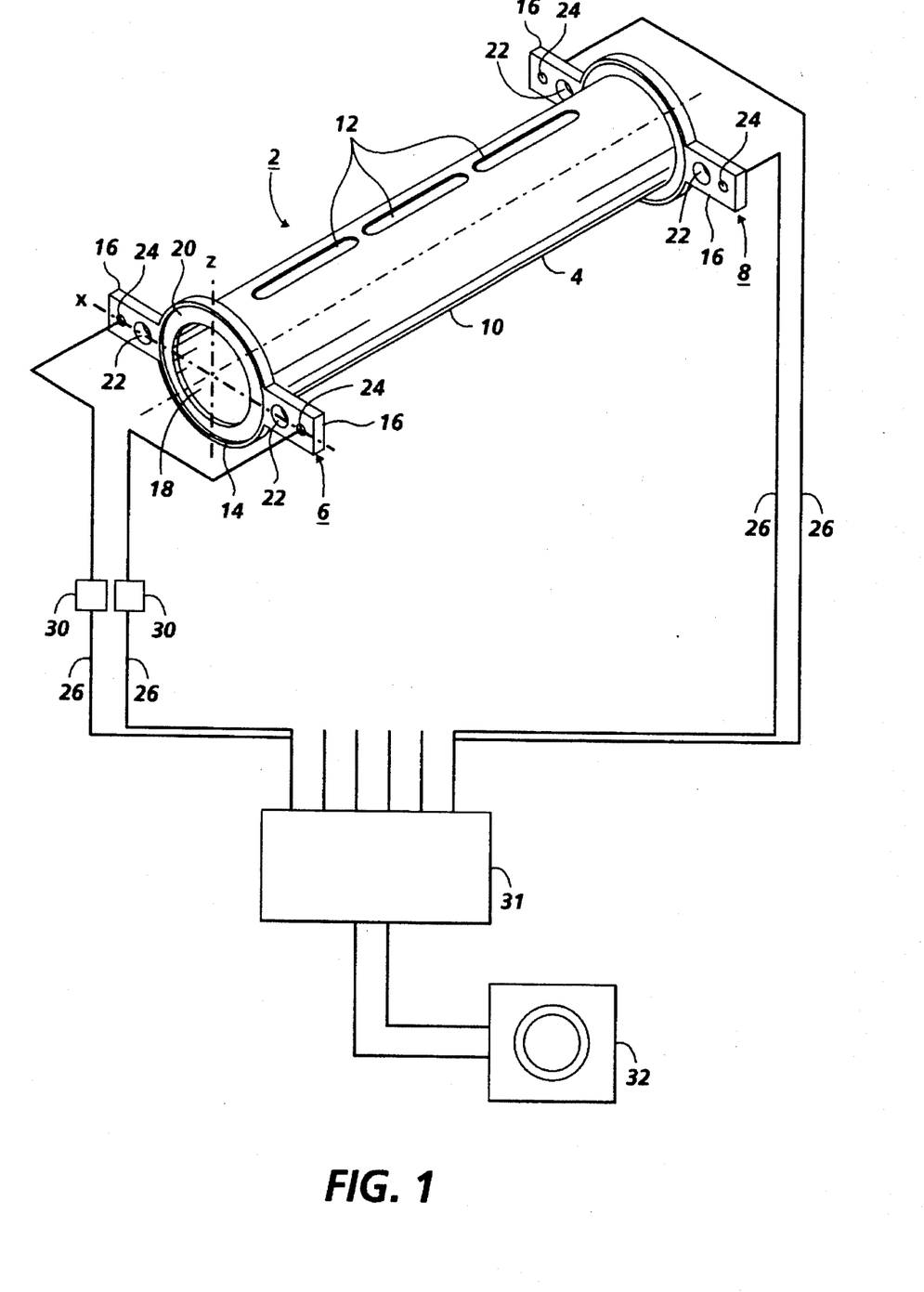
FIG. 1 represents a schematic, perspective view of one embodiment of the instant invention.

In FIG. 1, the crucible assembly 2 comprises a tube 4 and a pair of end members (6, 8). The bottom inner surface of the tube 4 may be smooth. The bottom portion of the tube is also referred herein as the floor 10. The tube defines an exit opening 12 which may be for example one, two, three, or more slits which are longitudinally aligned with the axis of the tube. The opening 12 may be located at the top of the tube 4 above an imaginary horizontal line x which bisects the crucible assembly. A first end member 6 is shown which includes a circular portion 14 and an integral pair of arm members 16 disposed directly opposite one another on the circular portion. The circular portion 14 defines a hole 18 which may have the same or similar size as the inner cross-sectional dimension of the tube. The rim of the hole 18 may be coupled to an end portion of the tube such as by use of welding, an adhesive, and/or a fastening device like a screw, a bolt, or a rivet. The circular portion may further define a recessed flange 20 concentric with the hole 18. A cover plate (not shown) contacts the flange to seal the hole 18. A pair of screws and spring tabs (not shown) mounted for example on the arm members 16 releasably secures the cover plate over the hole. The solid material to be subjected to sublimation is loaded into the tube through the hole 18 which is subsequently sealed with the cover plate. The arm members 16 define a pair of support rod holes 22. A support rod (not shown) goes into each support rod hole to mount the crucible assembly 2 to for example a vacuum coater (not shown). Each arm member 16 includes at least one power connection area 24 which may define for example an opening.

In FIG. 1, the crucible assembly 2 defines an imaginary horizontal line x and an imaginary vertical line z, perpendicular to one another, wherein lines x and z bisect the first end member. In embodiments, lines x and z may also bisect the tube 4 and the second end member 8. As seen in FIG. 1, the two power connection areas 24 of the first end member 6, which may be power input connection areas, are preferably positioned on the horizontal axis x and equidistant from the vertical axis z. In embodiments of the instant invention, the two power connection areas of the first end member may be positioned in any arrangement relative to lines x and z including for example the following: both above the horizontal line x at the same or different distance from line x; both below the horizontal line x at the same or different distance from line x; both positioned on the vertical line z; both in the same quadrant (there are four quadrants defined by the two imaginary lines). Preferably, the two power connection areas of the first end member are symmetrically disposed where the term "symmetrical" means that the two power connection are positioned on opposite sides of line x or line z in a corresponding arrangement, i.e., a mirror image. FIG. 1 illustrates a symmetrical disposition of the power connection areas. Another example of a symmetrical disposition is where the two power connection areas of the first end member are positioned on opposite sides of line z at the same first distance away from line z and positioned on the same side of line x at the same second distance away from line x.

In embodiments of the instant invention, the first end member 6 may have more than two power connection areas such as three, four or more. For three power connection areas, they may be positioned in any arrangement relative to lines x and z including for example the following: two areas positioned as in FIG. 1 with the addition of a third power connection area above line x and positioned on line z; two areas positioned as in FIG. 1 with the addition of a third power connection area below line x and positioned on line z; two areas disposed above line x in adjacent quadrants and a third area disposed below line x and positioned on line z. For three power connection areas and other higher odd numbers of areas, the term "symmetrical" means that an equal number of power connection areas are positioned on opposite sides of line x or line z in a corresponding arrangement, i.e., a mirror image, and the remaining odd numbered area is positioned on line z, preferably at the 12:00 position. For four or more power connection areas on the first end member, they may be positioned in any arrangement relative to lines x and z including for example the following: two areas positioned as in FIG. 1 and two areas positioned on opposite sides of and equidistant from line x and positioned on line z; and one area in each of the four quadrants. For four power connection areas and other higher even numbers, the term "symmetrical" means that the areas are positioned on opposite sides of line x and/or line z in a corresponding arrangement, i.e., a mirror image, including where the power connection areas are located at the 9:00, the 12:00, the 3:00, and the 6:00 positions.

The following positions are preferred: the at least two power connection areas are positioned on opposite sides of the imaginary vertical line z, especially symmetrically; wherein the at least two power connection areas are positioned on opposite sides of the imaginary horizontal line x, especially symmetrically; and wherein the end member (6,8) comprises two power connection areas and a pair of arm members wherein each of the arm members includes one power connection area and the two power connection areas are symmetrically positioned on opposite sides of the imaginary vertical line z.

The number and positioning of the arm members may correspond to the number and positioning of the power connection areas. For example, there may be three, four, or more arm members. Alternatively, instead of arm members, there may be a collar member extending around and beyond the circular portion to accommodate the power connection areas.

The second end member 8 may have the same or similar design and configuration as the first end member and is coupled to the tube by the methods described herein. Since the crucible assembly is part of a complete electrical circuit, the power connection areas on the second end member provide for completion of the electrical circuit to power supply 31. In embodiments of the instant invention where access to the interior of the tube need not be made through the second end member, the second end member may comprise the circular portion and the integral pair of arm members, where the circular portion is a completely closed solid piece and thus the cover plate is not needed.

In FIG. 1, each power connection area 24 of the first end member 6 is coupled to a power cable 26, thereby enabling the connection of a plurality of power cables such as two, three, four, or more (depending on the number of power connection areas) to the first end member. The same or different number of power cables may be connected to the second end member 8 to complete the electrical circuit whereby the crucible assembly acts like a resistor. The power cables may be connected to the same or separate power source. The power cables may be separate cables or may be branches of one cable coupled to a single power source. The power cables and a power source are coupled to the end members as illustrated for example in FIG. 1 to resistively heat the crucible assembly. In FIG. 1, the power source 31 may be a DC power source or an alternating current power source which acts through variac 32 to output a power level ranging for example from about 100 to about 6,000 watts, and preferably from about 500 to about 5,000 watts. The current measured at current transformer 30 ranges for example from about 100 to about 500 amps, and preferably from about 200 to about 400 amps. The temperature of the heated crucible assembly ranges from about 100° to about 700° C., and preferably from about 400° to about 650° C. The crucible assembly is resistively heated for a time ranging from about 10 minutes to about 3 hours, and preferably from about 30 minutes to about 2 hours. In FIG. 1, current transformers 30 may be for example step-down transformers enabling the measurement of alternating currents of up to 500 amps in power cables 26 when used in conjunction with a current meter having a full scale deflection of 5 amps.

Figure 2:
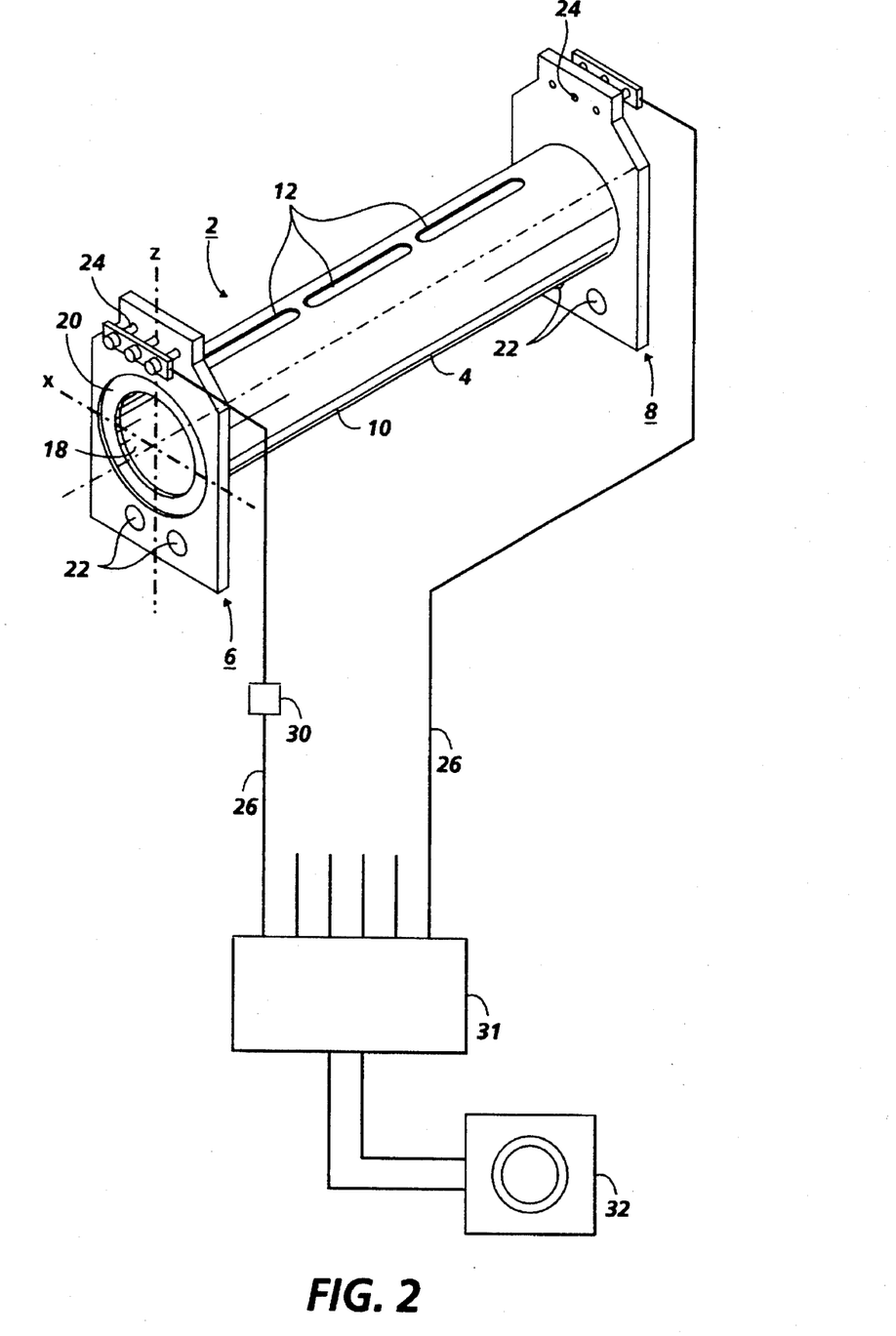
FIG. 2 represents a schematic, perspective view of an alternate embodiment of the instant invention.

FIG. 2 represents another embodiment of the present invention where the design of the crucible assembly enhances the current density around the perimeter of the exit opening to minimize condensate clogging. The crucible assembly 2 comprises a tube 4 and a pair of end members (6, 8). The bottom inner surface of the tube may be smooth. The tube 4 defines an exit opening 12 which may be for example one, two, three or more slits which are longitudinally aligned with the axis of the tube. The opening 12 may be located at the top of the tube above an imaginary horizontal line x which bisects the crucible assembly. The first end member 6 defines a hole 18 which may have the same or similar size as the inner cross-sectional dimension of the tube. The rim of the hole may be coupled to an end portion of the tube such as by use of welding, an adhesive, and/or a fastening device like a screw, a bolt, or a rivet. The first end member 6 may further define a recessed flange 20 concentric with the hole 18. A cover plate (not shown) contacts the flange to seal the hole 18. A pair of screws and spring tabs (not shown) mounted on the first end member releasably secures the cover plate over the hole. The solid material to be subjected to sublimation is loaded into the tube through the hole which is subsequently sealed with the cover plate. The first end member may also define a pair of support rod holes 22. A support rod (not shown) goes into each support rod hole to mount the crucible assembly to for example a vacuum coater (not shown). In FIG. 2, a single power connection area 24 (for example three holes in the first end member which allow for example a metal bar coupled to a single power cable to be attached by bolts to the three holes) is positioned at the top of the first end member 6 above the horizontal line x.

In FIG. 2, the crucible assembly defines an imaginary horizontal line x and an imaginary vertical line z, perpendicular to one another, wherein lines x and z bisect the first end member. In embodiments, lines x and z may also bisect the tube 4 and the second end member 8. In embodiments of the instant invention, the power connection area may be positioned in any arrangement at or above the horizontal line x; the power connection areas may be positioned in any arrangement on or spaced from vertical line z. A preferred position is where the power connection area is positioned on the imaginary vertical line z, especially at the 12:00 position.

In FIG. 2, the second end member 8 may have the same or similar design and configuration as the first end member and is coupled to the tube by the methods described herein. Since the crucible assembly is part of a complete electrical circuit, the power connection area on the second end member provide for completion of the electrical circuit to power supply 31. In embodiments of the instant invention where access to the interior of the tube need not be made through the second end member, the second end member is a completely closed solid piece and thus the cover plate is not needed.

A power cable 26 and a power source may be coupled to the end members (6,8) as illustrated in FIG. 2 to resistively heat the crucible assembly. In FIG. 2 the power source 31 may be a DC power source or an alternating current power source which acts through variac 32 to output a power level ranging for example from about 100 to about 6,000 watts, and preferably from about 500 to about 5000 watts. The current measured at current transformer 30 ranges from about 100 to about 800 amps, and preferably from about 200 to about 500 amps. The temperature of the heated crucible assembly ranges from about 100° to about 700° C., and preferably from about 400° to about 650° C. The crucible assembly is resistively heated for a time ranging from about 10 minutes to about 3 hours, and preferably from about 30 minutes to about 2 hours. In FIG. 2, the current transformer 30 may be for example a step-down transformer enabling the measurement of alternating currents of up to 500 amps in power cable 26 when used in conjunction with a current meter having a full scale deflection of 5 amps.

The configuration of the end members in FIG. 2 and similar embodiments ensures that the preferred current path would be along the exit opening and not for example along the tube floor 10 as for the crucible assembly of Comparative Example 1 discussed herein. The crucible assembly of FIG. 2 and similar embodiments may improve the probability of reducing or eliminating condensate clogging in the exit opening by ensuring that the exit opening temperature may be higher than the tube floor temperature by a temperature difference ranging for example from about 20° to about 50° C.

In FIGS. 1–2, the power connection areas are positioned on integral end members which act as discrete end plates of the tube. However, it is possible that the power connection areas are positioned on one, two, or more members which are not part of an end plate or which are not integral with each other. For example, an end of the tube may be closed and two separate arm members, each containing a power connection area, may be coupled to the outer surface of the tube. The present invention encompasses these situations where the power connection area or areas are positioned on one, two, or more members which are not part of an end plate or which are not integral with each other.

In embodiments of the instant invention, the current leads from strands of a single power cable or from multiple power cables may be closely spaced together such as for example from about 1 to about 10 mm apart on the end members. Such closely spaced current leads may represent a single power connection area.

In the instant invention, the crucible assembly including the tube and the end members may be fabricated from an electrically conductive material such as a metal like stainless steel, iron, copper, or nickel.

The invention will now be described in detail with respect to specific preferred embodiments thereof, it being understood that these examples are intended to be illustrative only and the invention is not intended to be limited to the materials, conditions or process parameters recited herein. All percentages and parts are by weight unless otherwise indicated.

EXAMPLE 1

Figure 4:
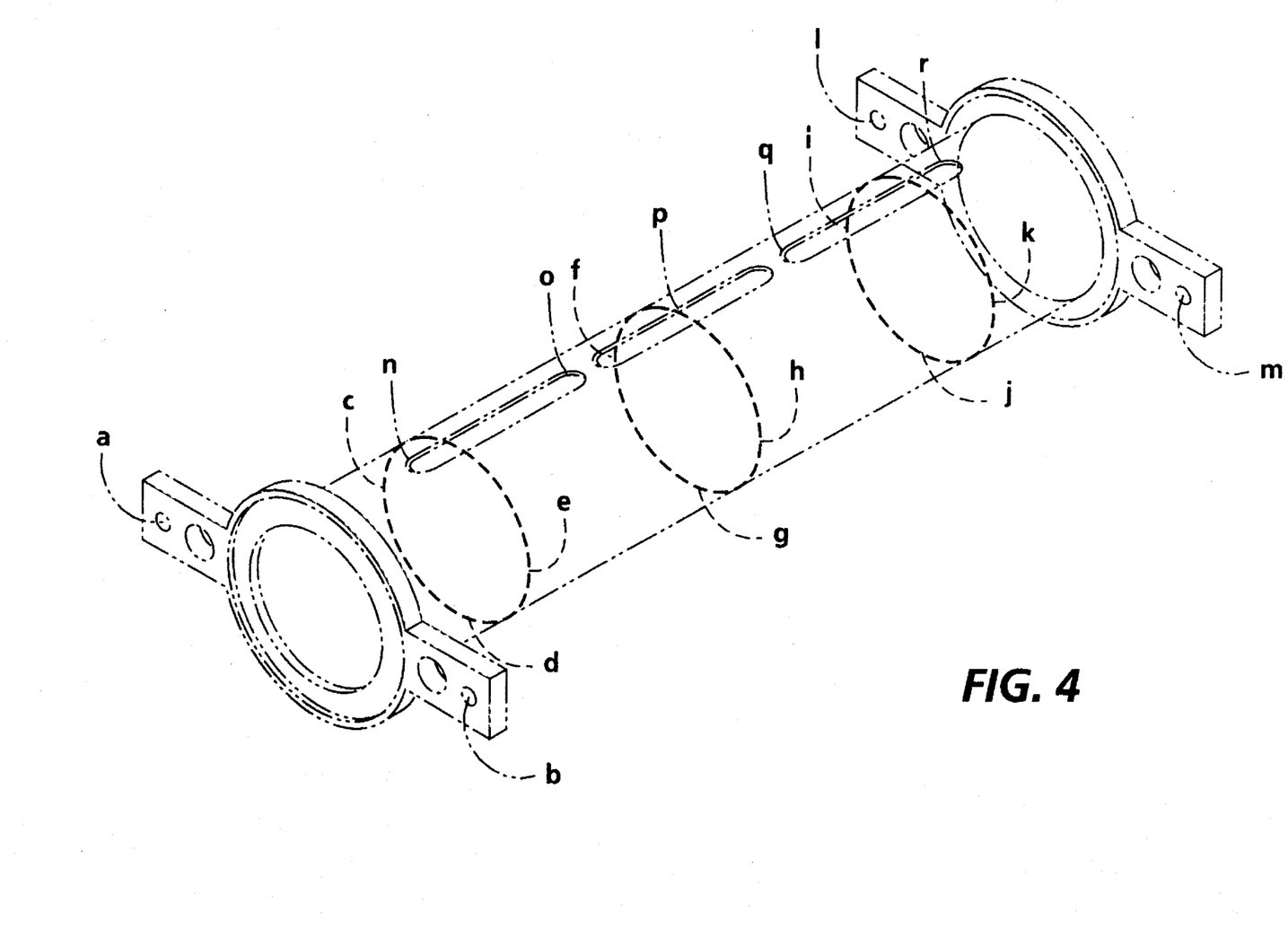
FIG. 4 represents a temperature profile of the crucible assembly of FIG. 1 employed in Example 1.

The crucible assembly illustrated in FIG. 1 and described herein was used for this example. The tube was fabricated from stainless steel and had the following dimensions: a length of about 2 feet, an outer diameter of about 5 inches, a wall thickness of about 0.020 inches, a slit width of about ½ inch. The end members had a thickness of about ⅛ inch and were fabricated from 304–316 stainless steel. The empty crucible assembly was mounted in a vacuum chamber and resistively heated under vacuum at about 0.5 kilowatts and 200 amps for 12 minutes, then at about 1.0 kilowatts and 285 amps for an additional 8 minutes and finally at about 1.5 kilowatts and 335 amps for a further 6 minutes using an alternating current power supply. At this time the temperature of the crucible assembly was measured along various locations indicated in FIG. 4 by the reference letters a–r, wherein the resulting composite temperature profile (obtained through a multiplicity of 4 identical runs in which a different set of 8 of the temperature measurement positions a–r was monitored in each run) was the following:

a: 688;
b: 666;
c: 598;
d: 602;
e: 612;
f: 590;
g: 601;
h: 612;
i: 599;
j: 590;
k: 604;
l: 693;
m: 652;
n: 591;
o: 593;
p: 587;
q: 589;
r: 586;

wherein the above values are in degrees centigrade.

About 300 g of benzimidazole perylene pigment in the form of compressed cylindrical pellets, each pellet weighing about 0.5 g, was loaded into the tube. The loaded crucible assembly, mounted in a vacuum chamber, was resistively heated under vacuum first at about 0.5 kilowatts and 200 amps for 10 minutes and then at about 1.3 kilowatts and 325 amps for an additional 30 minutes using an alternating current power supply. No condensate clogging of the slits was visually observed during the 30 minutes of resistive heating at 1.3 kilowatts and 325 amps. During this time benzimidazole perylene, sublimed from the source material loaded in the crucible, was collected as condensate on a stainless steel receiver sheet mounted approximately 9 inches above the crucible exit slits. The benzimidazole perylene condensate so collected was scraped from the receiver sheet at the end of the experiment and weighed. The benzimidazole perylene condensate scraped from the receiver sheet was found to weigh 104.4 g. During the time of resistive heating of the crucible at 1.3 kilowatts and 325 amps the temperature of the crucible assembly was measured at 8 of the 18 temperature measuring positions a–r wherein the resulting temperature profile was the following:

a:
b:
d: 585;
e:
f: 578;
g: 585;
h: 603;
i:
j: 573;
k:
l:
m:
n: 589;
o:
p: 596;
q:
r: 593;

wherein the above values are in degrees centigrade.

It should be noted that the crucible temperatures measured at the exit slit locations n: 589, p: 596, r: 593 are all higher by several degrees centigrade than the corresponding crucible "floor" location temperatures d: 585, g: 585, j: 573.

The loaded crucible experiment was repeated with a fresh 300 g load of benzimidazole perylene compressed 0.5 g pellets and produced essentially identical observations, conclusions and results.

COMPARATIVE EXAMPLE I

Figure 3:
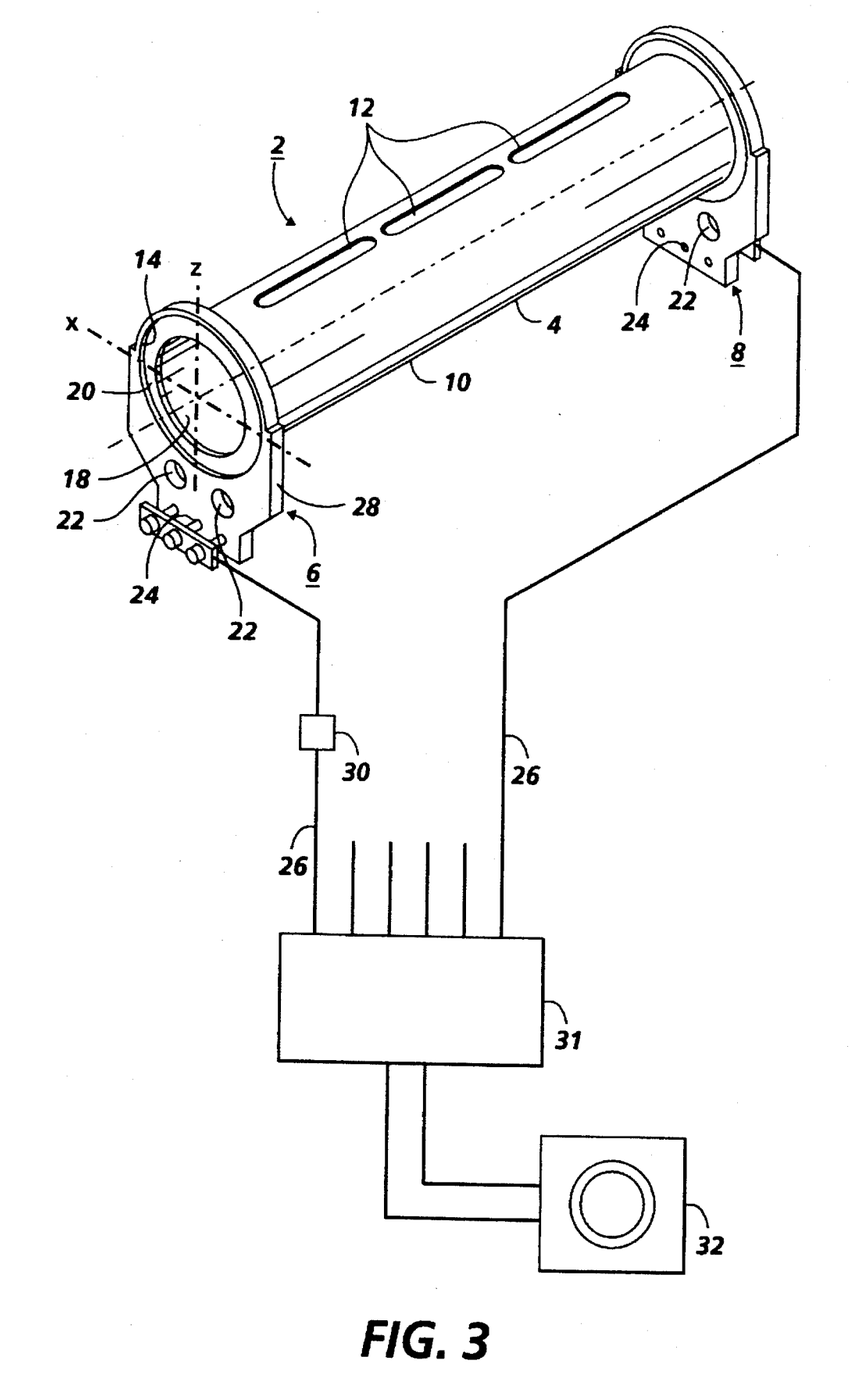
FIG. 3 represents a schematic, perspective view of a comparative crucible assembly.

The crucible assembly 2 illustrated in FIG. 3 was used for this example. The crucible assembly 2 comprised a tube 4 and a pair of end members (6, 8). The tube 4 defined a plurality of slits 12 which were longitudinally aligned with the axis of the tube. The tube was fabricated from the same material and had the same dimensions as the tube used in Example 1. The first end member 6 included a circular portion 14 and an integral cradle portion 28. The circular portion 14 defined a hole 18 which had the same size as the inner cross-sectional dimension of the tube. The rim of the hole 18 was coupled to an end portion of the tube by welding. The circular portion 14 further defined a recessed flange 20 concentric with the hole 18. A cover plate (not shown) contacted the flange to seal the hole. A pair of screws and spring tabs (not shown) mounted on the cradle portion 28 releasably secured the cover plate over the hole. The cradle portion 28 defined a pair of support rod holes 22. A support rod (not shown) went into each support rod hole to mount the crucible assembly to a vacuum coater (not shown). The cradle portion 28 further defined a power connection area 24—an area including three holes in the cradle portion which allowed a metal bar coupled to a single power cable 26 to be attached to the three holes via three bolts. The second end member 8 had the same design and configuration as the first end member 6 and is welded to the tube. The end members had a thickness of about ⅛ inch and were fabricated from 304–316 stainless steel. In FIG. 3, the current transformer 30 was a step-down transformer enabling the measurement of alternating currents of up to 500 amps in power cable 26 when used in conjunction with a current meter having a full scale deflection of 5 amps.

Figure 5:
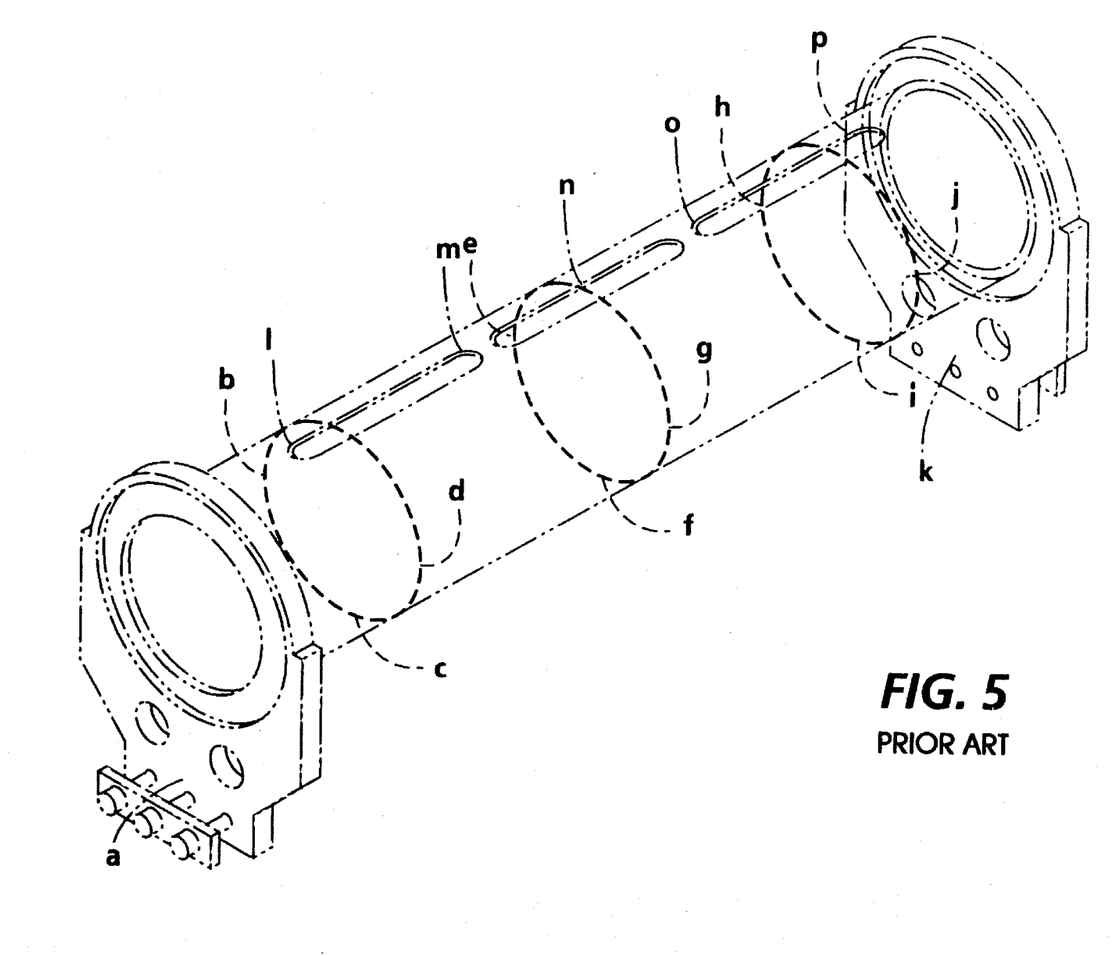
FIG. 5 represents a temperature profile of the crucible assembly of FIG. 3 employed in Comparative Example 1.

The empty crucible assembly was mounted in a vacuum chamber and resistively heated under vacuum at about 1.0 kilowatts for 12 minutes, at about 2.0 kilowatts for an additional 8 minutes, then at about 3.0 kilowatts for a further 6 minutes and finally at about 4.0 kilowatts for 20 minutes using an alternating current power supply 31 which acts through variac 32. At this time the temperature of the crucible assembly was measured along various locations indicated in FIG. 5 by the reference letters a–p, wherein the resulting composite temperature profile (obtained through a multiplicity of 10 identical runs in which a different set of 8 of the 16 temperature measurement positions a–p was monitored in each run) was the following:

a: 552;
b: 597;
c: 608;
d: 581;
e: 598;
f: 585;
g: 585;

h: 597;
i: 609;
j: 586;
k: 561;
l: 570;
m: 580;
n: 576;
o: 570;
p: 562;
wherein the above values are in degrees centigrade.

About 300 g of benzimidazole perylene pigment in the form of compressed cylindrical pellets, each pellet weighing about 0.5 g, was loaded into the tube. The crucible assembly was mounted in a vacuum chamber and resistively heated under vacuum at about 2 kilowatts for 10 minutes and then at about 4 kilowatts for 30 minutes using an alternating current power supply. It was visually observed that condensate clogging of the crucible exit slits commenced after about 25 minutes of the 30 minute period of resistive heating at 4 kilowatts.

During the time of resistive heating of the crucible at 4.0 kilowatts the temperature of the crucible assembly was measured at 8 of the 16 temperature measuring positions a–p wherein the resulting temperature profile was the following:

a:
b:
c: 630;
d:
e: 603;
f: 593;
g: 595;
h:
i: 609;
j:
k
l: 589;
m:
n: 611;
o:
p: 589;
wherein the above values are in degrees centigrade.

It should be noted that the crucible temperatures measured at the ends of the exit opening l: 589; p: 589 are both lower by 41 degrees centigrade and 20 degrees centigrade, respectively, than the corresponding temperatures measured at the crucible tube floor, viz, c: 630; i:609 whereas the temperature measured near the center of the exit opening, n: 611, exceeds the temperature measured at the corresponding position at the crucible tube floor, f: 593.

The loaded crucible experiment was repeated two more times, each with a fresh 300 g load of benzimidazole perylene compressed 0.5 g pellets, and each produced essentially identical observations, conclusions and results.

As discussed above, the crucible assembly of Comparative Example 1 was susceptible to condensate clogging of the exit opening. The crucible assembly of Comparative Example 1 exhibited point-to-point temperature differentials of as much as about 47° C. at nominal operating temperatures of up to about 600° C. The temperature profile of the crucible assembly of Comparative Example 1 indicated a large temperature differential between the floor of the tube and the ends of the exit opening. Significantly, localized condensate clogging occurred first at the extreme ends of the exit opening which were the coldest points of the tube.

The instant invention in embodiments reduced the temperature difference between the floor of the tube and the perimeter of the exit opening. In Comparative Example 1, the temperature differential between the floor of the tube and the perimeter of the exit slits was as much as about 47° C., whereas in Example 1, the temperature differential was at most about 16° C. The crucible assembly of Example 1 was made more thermally uniform by admitting electric current to the tube more symmetrically, i.e., using the symmetrical geometry power connection areas on the end members, rather than the asymmetric geometry implied by the end members of Comparative Example 1 (FIG. 3). The symmetrical arrangement of the power connection areas for the crucible assembly of Example 1 allows for greater symmetry of the current pathways along the length of the tube. In particular, the current density along the exit opening and along the floor of the tube should be more nearly equal. As a result, the tube temperature near the exit opening should be much closer to the temperature along the tube floor and the tendency for vapor condensation in the exit opening should be reduced or eliminated.

Other modifications of the present invention may occur to those skilled in the art based upon a reading of the present disclosure and these modifications are intended to be included within the scope of the present invention.

We claim:

1. A crucible assembly comprising:
 (a) an electrically conductive tube having a first end portion and a second end portion, a tube floor and at least one opening in the surface of the tube opposing the tube floor, wherein the tube defines a vertical plane from the at least one opening across to the tube floor and which also bisects the end portions of the tube, and a first horizontal line which bisects the first end portion of the tube and a second horizontal line which bisects the second end portion of the tube, said first and second lines being perpendicular to the vertical plane;
 (b) a first end member having a hole and a rim connected to the first end portion of the tube, said first end member having at least two power connection areas, wherein the at least two power connection areas are positioned on opposite sides of the vertical plane and approximately along the first horizontal line of the first end portion of the tube;
 (c) a second end member having a hole and a rim connected to the second end portion of the tube, said second end member having at least two power connection areas, wherein the at least two power connection areas are positioned on opposite sides of the vertical plane and approximately along the second horizontal line of the second end portion of the tube;
 whereby condensation near the at least one opening is reduced or eliminated.

2. The crucible assembly of claim 1, wherein there are only two power connection areas to permit the coupling of only two power cables.

3. The crucible assembly of claim 1, wherein the at least two power connection areas are symmetrically positioned on opposite sides of the vertical plane.

4. The crucible assembly of claim 1, wherein the at least two power connection areas are positioned on the horizontal line.

5. The crucible assembly of claim 1, further comprising a single power source coupled to the at least two power connection areas.

6. The crucible assembly of claim 1, wherein the at least one opening is a slot longitudinally aligned with the axis of the tube.

7. A crucible assembly comprising:
(a) an electrically conductive tube having a first end portion and a second end portion, a tube floor and at least one opening in the surface of the tube opposing the tube floor, wherein the tube defines a vertical plane from the at least one opening across to the tube floor and which also bisects the end portions of the tube, and a first horizontal line which bisects the first end portion of the tube and a second horizontal line which bisects the second end portion of the tube, said first and second lines being perpendicular to the vertical plane;
(b) a first end member coupled to the first end portion of the tube comprises a pair of arm members wherein each of the arm members includes one power connection area and the each of the power connection areas is symmetrically positioned on opposite sides of the vertical plane;
(c) a second end member coupled to the second end portion of the tube comprises a pair of arm members wherein each of the arm members includes one power connection area and the each of the power connection areas is symmetrically positioned on opposite sides of the vertical plane;
whereby condensation near the at least one opening is reduced or eliminated.

* * * * *